United States Patent
Lee

(10) Patent No.: US 6,695,925 B1
(45) Date of Patent: Feb. 24, 2004

(54) METHOD AND EQUIPMENT FOR CLEANING THE DISPERSION HEAD

(75) Inventor: Ching-Lun Lee, Hsinchu (TW)

(73) Assignee: Winbond Electronics, Hsinchu (TW)

( * ) Notice: Subject to any disclaimer, the term of this patent is extended or adjusted under 35 U.S.C. 154(b) by 169 days.

(21) Appl. No.: 09/665,198

(22) Filed: Sep. 18, 2000

(30) Foreign Application Priority Data

Feb. 3, 2000 (TW) .......................................... 89102006 A

(51) Int. Cl.⁷ ................................................ B08B 7/04
(52) U.S. Cl. ............................ 134/1; 134/22.1; 134/26; 134/30; 438/905
(58) Field of Search ................................ 134/186, 902, 134/134, 1, 2, 22.1, 26, 28, 29, 30; 438/905

(56) References Cited

U.S. PATENT DOCUMENTS 5,271,963 A * 12/1993 Eichman et al. ......... 427/248.1
5,522,412 A * 6/1996 Ohba et al. ................... 118/70
RE36,925 E * 10/2000 Ohba et al. ................... 118/70
6,352,081 B1 * 3/2002 Lu et al. ....................... 134/1.1

* cited by examiner

Primary Examiner—Alexander Markoff
(74) Attorney, Agent, or Firm—Allen, Dyer, Doppelt, Milbrath & Gilchrist, P.A.

(57) ABSTRACT

A method and an equipment for cleaning a dispersion head of a chemical vapor deposition (CVD) machine applied to the semiconductor manufacturing industry are provided. The method includes the steps of providing a chemical reaction tank for immersing the dispersion head therein and cleaning the dispersion head with ultrasonic, providing a water tank for immersing the dispersion head therein, providing an organic solvent tank for immersing the dispersion head therein, and providing a drying system for drying the dispersion head. The equipment comprises a chemical reaction tank for immersing the dispersion head therein and cleaning the dispersion head with ultrasonic, a water tank for immersing the dispersion head therein, an organic solvent tank for immersing the dispersion head therein, and a drying system for drying the dispersion head.

13 Claims, 4 Drawing Sheets

METHOD AND EQUIPMENT FOR CLEANING THE DISPERSION HEAD

FIELD OF THE INVENTION

The present invention is related to a method and an equipment for cleaning a dispersion head, and particularly to a method and an equipment for cleaning a dispersion head of a chemical vapor (CVD) deposition machine.

BACKGROUND OF THE INVENTION

With progress of the semiconductor industry, the periodic maintenance (PM) of the semiconductor parts plays an important role in the semiconductor industry. As we know, the dispersion head of the chemical vapor deposition (CVD) machine is used for uniformly depositing the desired materials on the surface of the wafer. It's expectable that a lot of particles would be formed on the surface of the dispersion head after a specific period of running time, and thus the product yield is lowered. Therefore, it's necessary to clean the dispersion head. However, according to the prior art, it takes long time to clean the dispersion head, and thus the running time of the chemical vapor deposition (CVD) machine is shortened. Besides, according to the prior art, the dispersion head is easily damaged during the cleaning process. If the damaged dispersion head is still used for running the chemical vapor deposition machine, the yield of the semiconductor product would be lowered. If the damaged dispersion head is being replaced with a new one, the cost for maintaining the dispersion head is expectably raised.

Please refer to FIG. 1 which is a schematic diagram showing a structure of a chemical vapor deposition (CVD) machine. While the chemical vapor deposition machine 11 is running, a few particles which are not tightly deposited on the wafer 17 would fall to the outer cover 14 and the surface 15 of the dispersion head 12. The chemical vapor deposition machine 11 is first vacuumed for removing the particles remained on the cover 14 and the surface 15 of the dispersion head 12. After the dispersion head 12 and the outer cover 14 is disassembled from the chemical vapor deposition machine, the particles remained on the surface 16 of the chemical vapor deposition machine are then removed. Thereafter, according to the prior art, the isolating plates 13 are taken out and then scrubbed at the end.

Therefore, according to the prior art, the conventional cleaning method has some disadvantages as follows. First of all, it takes long time to clean the dispersion head. Besides, the dispersion head is easy to be damaged during the cleaning process, and thus the cost for maintaining the dispersion head is raised. Moreover, the yield of the semiconductor product is lowered.

SUMMARY OF THE INVENTION

An object of the present invention is to provide a method and an equipment for rapidly and effectively cleaning the dispersion head.

Another object of the present invention is to provide a method and an equipment for lowering the cost of maintaining the dispersion head.

A further object of the present invention is to provide a method and an equipment for raising the yield of the semiconductor product.

According to the object of the present invention, a method for cleaning a dispersion head of a chemical vapor deposition (CVD) machine applied to the semiconductor manufacturing industry is provided. The method comprises the steps of a) providing a chemical reaction tank for immersing said dispersion head therein and cleaning said dispersion head with ultrasonic, b) providing a water tank for immersing said dispersion head therein, c) providing an organic solvent tank for immersing said dispersion head therein and d) providing a drying system for drying said dispersion head.

The chemical vapor deposition machine is one of an atmosphere chemical vapor deposition machine and a sub-atmosphere chemical vapor deposition machine. The chemical vapor deposition machine is used for depositing a silicon oxide glass selected from a group consisting of Boron-phosphorous Silicon Dioxide (BPSG), Boron Silicon Dioxide (BSG), Phosphorous Silicon Dioxide (PSG), Undoping Silicon Dioxide (USG) and Non-doping Silicon Dioxide (NSG).

Preferably, the chemical reaction tank is an aqueous solution containing 12% hydrogen peroxide ($H_2O_2$), and the aqueous solution further contains sodium ion ($Na^+$) and potassium ion ($K^+$).

Preferably, the water tank is an overflow water tank.

Preferably, the organic solvent tank is an isopropyl alcohol (IPA) tank which is equipped with recyclable pipe.

Preferably, the drying system is controlled at a temperature of 120° C. The drying system is equipped with injected nitrogen gas. The drying system further includes a mesh for dispersing heated nitrogen gas, thereby smoothly passing said nitrogen gas through said dispersion head. The mesh is made of aluminum.

According to another object of the present invention, an equipment for cleaning a dispersion head of a chemical vapor deposition (CVD) machine applied to the semiconductor manufacturing industry is provided. The equipment comprises a chemical reaction tank for immersing said dispersion head therein and cleaning said dispersion head with ultrasonic, a water tank for immersing said dispersion head therein, an organic solvent tank for immersing said dispersion head therein, and a drying system for drying said dispersion head.

The chemical vapor deposition machine is one of an atmosphere chemical vapor deposition machine and a sub-atmosphere chemical vapor deposition machine. The chemical vapor deposition machine is used for depositing a silicon oxide glass selected from a group consisting of Boron-phosphorous Silicon Dioxide (BPSG), Boron Silicon Dioxide (BSG), Phosphorous Silicon Dioxide (PSG), Undoping Silicon Dioxide (USG) and Non-doping Silicon Dioxide (NSG).

Preferably, the chemical reaction tank is an aqueous solution containing 12% hydrogen peroxide ($H_2O_2$), and the aqueous solution further contains sodium ion ($Na^+$) and potassium ion ($K^+$).

Preferably, the organic solvent tank is an isopropyl alcohol (IPA) tank.

Preferably, the drying system is equipped with injected nitrogen gas. The drying system further includes a mesh for dispersing heated nitrogen gas, thereby smoothly passing said nitrogen gas through said dispersion head. The mesh is made of aluminum.

The present invention may best be understood through the following description with reference to the accompanying drawings, in which:

DETAILED DESCRIPTION OF THE PREFERRED EMBODIMENTS

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The present invention is related to a method and an equipment for cleaning a dispersion head of a chemical vapor (CVD) deposition machine applied to the semiconductor manufacturing industry. The chemical vapor deposition machine is used for depositing a silicon oxide glass selected from a group consisting of Boron-phosphorous Silicon Dioxide (BPSG), Boron Silicon Dioxide (BSG), Phosphorous Silicon Dioxide (PSG), Undoping Silicon Dioxide (USG) and Non-doping Silicon Dioxide (NSG). Preferably, the chemical vapor deposition machine is an atmosphere chemical vapor deposition machine or a sub-atmosphere chemical vapor deposition machine.

Figure 1:
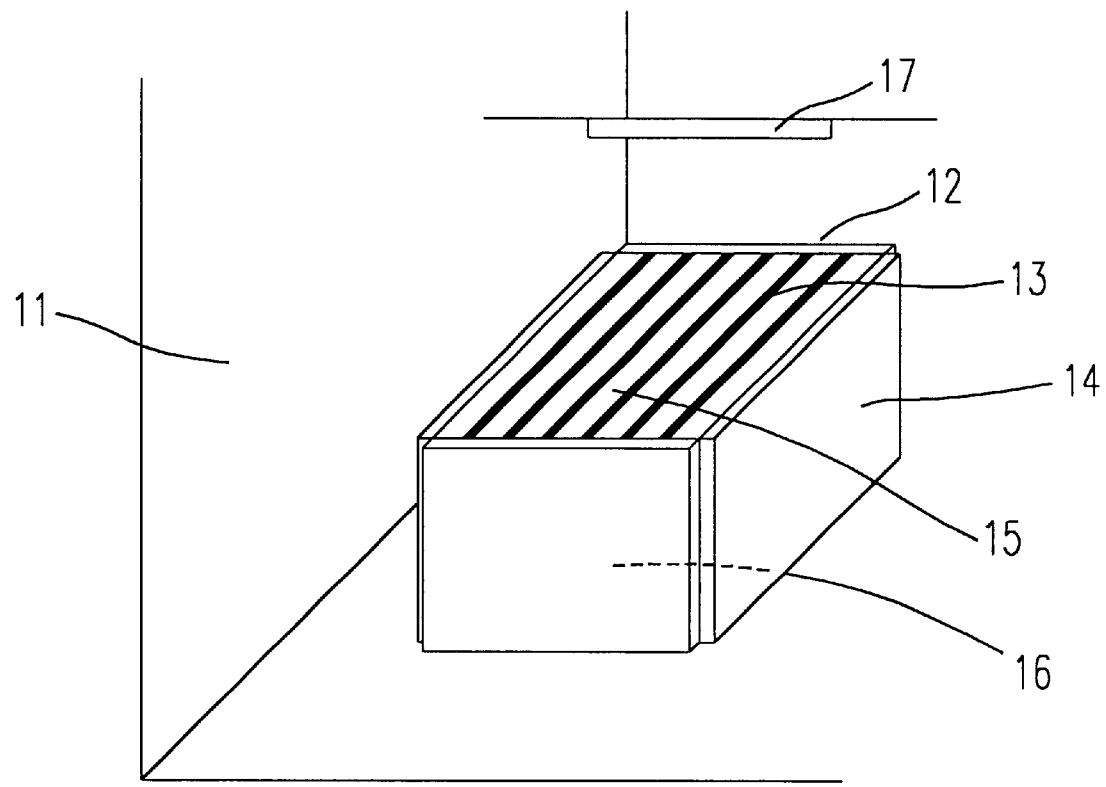
FIG. 1 is a schematic diagram showing a structure of a chemical vapor deposition (CVD) machine.

For more specifically understanding the present invention, please refer to FIG. 1 which is a schematic diagram showing a structure of a chemical vapor deposition (CVD) machine. While the chemical vapor deposition machine 11 is running, a few particles which are not tightly deposited on the wafer 17 would fall to the outer cover 14 and the surface 15 of the dispersion head 12. The chemical vapor deposition machine 11 is first vacuumed for removing the particles remained on the cover 14 and the surface 15 of the dispersion head 12. After the dispersion head 12 and the outer cover 14 are disassembled from the chemical vapor deposition machine, the particles remained on the surface 16 of the chemical vapor deposition machine are then removed. Because the silicon oxide glass is formed on the surface of the isolating plates 13 after a period of producing time, according to the present invention, the isolating plates 13 are taken out, then immersed in a chemical reaction tank and cleaned with ultrasonic for removing the silicon oxide glass. The chemical reaction tank is an aqueous solution containing 12% hydrogen peroxide ($H_2O_2$). The aqueous solution further contains sodium ion ($Na^+$) and potassium ion ($K^+$).

Figure 2:
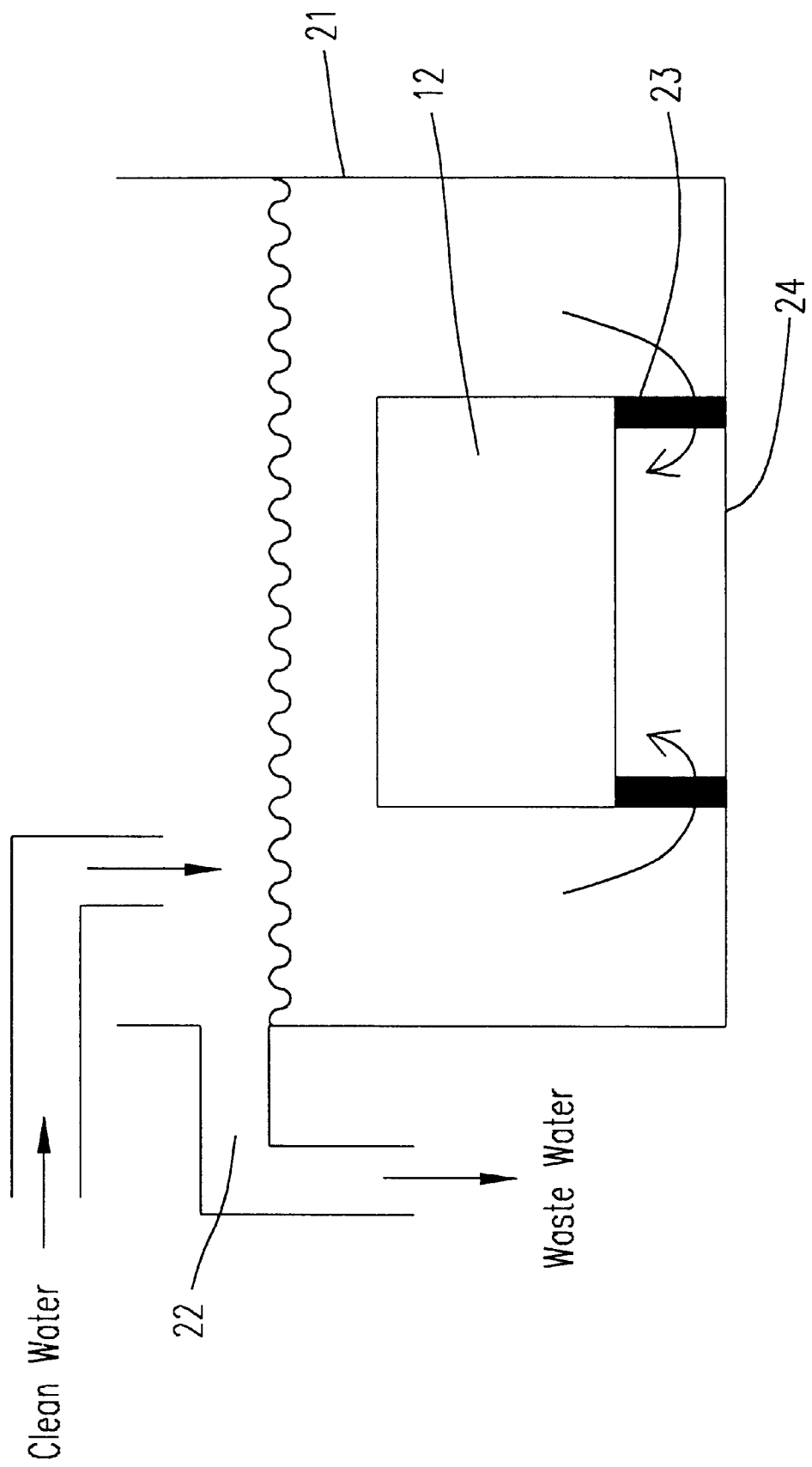
FIG. 2 is a schematic diagram showing a water tank for cleaning a dispersion head.

Please refer to FIG. 2 which is a schematic diagram showing a water tank for cleaning a dispersion head. After the dispersion head, 12 is cleaned in the chemical reaction tank, the dispersion head 12 is then immersed in the water tank 21. Clean water is continuously filled into the water tank 21, and waste water is continuously overflowed through the overflow hole 22. For clean water being smoothly passed through the dispersion head 12, the dispersion head 12 is spaced out from the bottom 24 of the water tank by the supporter 23. By measuring the water resistance value, we can make sure if the dispersion head 12 is completely cleaned.

Figure 3:
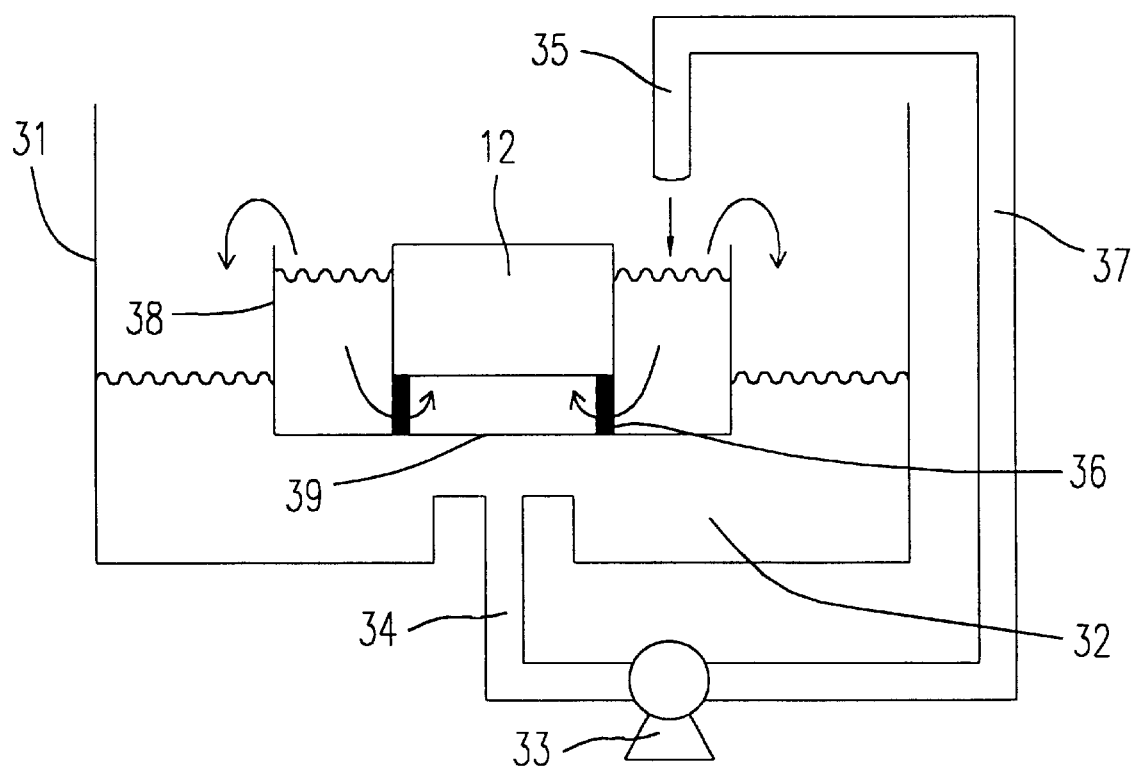
FIG. 3 is a schematic diagram showing an isopropyl alcohol (IPA) tank for cleaning a dispersion head.

Please refer to FIG. 3 which is a schematic diagram showing an isopropyl alcohol (IPA) tank for cleaning a dispersion head. After the dispersion head 12 is cleaned in the water tank 21, the dispersion head 12 is then immersed in the isopropyl alcohol (IPA) tank 31. The isopropyl alcohol (IPA) tank 31 is equipped with a recyclable pipe 37. Because of the running of the pump 33, the isopropyl alcohol is recycled through the outlet 34 and the inlet 35. For the isopropyl alcohol being smoothly passed through the dispersion head 12, the dispersion head 12 is spaced out from the bottom 39 of the overflow tank 38 by the supporter 36. The concavity 32 in the bottom of the isopropyl alcohol (IPA) tank 31 is used for accumulating the removed particles from the dispersion head 12, and the particles can be cleaned up after a period of time.

Figure 4:
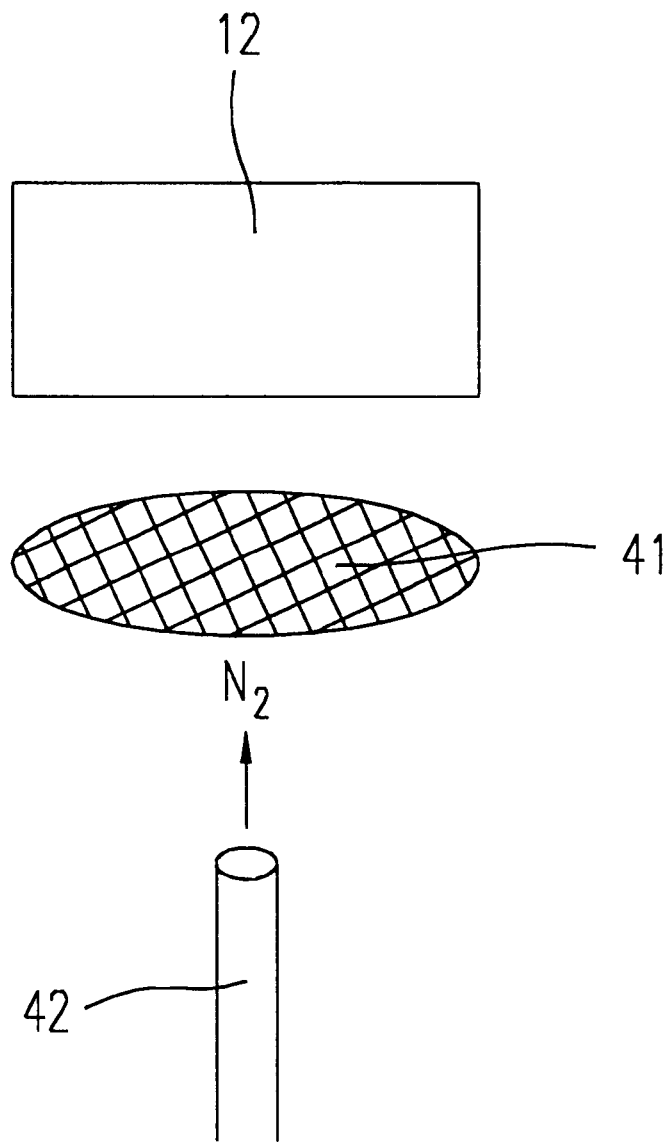
FIG. 4 is a schematic diagram showing a drying system for drying a dispersion head.

Please refer to FIG. 4 which is a schematic diagram showing a drying system for drying a dispersion head. After the dispersion head 12 is cleaned in the isopropyl alcohol (IPA) tank 31, the dispersion head 12 is then dried by the drying system. The drying system is controlled at a temperature of 120° C. the drying system is equipped with nitrogen gas injection system 42, and the drying system further includes a mesh 41 for dispersing heated nitrogen gas, thereby smoothly passing heated nitrogen gas through the dispersion head 12. Preferably, the mesh 41 is made of aluminum.

After the dispersion head is dried by the drying system, we can make sure if the dispersion head is completely cleaned by inspection through our eyes. Alternatively, after the cleaned dispersion head being assembled with the chemical vapor deposition (CVD) machine, we can make sure if the dispersion head is completely cleaned from the product yield by performing the chemical vapor deposition process.

In conclusion, according to the present invention, a method and an equipment for rapidly and effectively cleaning the dispersion head, lowering the cost of maintaining the dispersion head, and raising the yield of the semiconductor product is provided.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A method for cleaning a dispersion head of a chemical vapor deposition (CVD) machine applied to the semiconductor manufacturing industry, comprising the steps of:

a) removing the particles remaining on the surface and an outer cover of said dispersion head;

b) disassembling said dispersion head and said cover from said chemical vapor deposition machine, and then removing the particles remaining on said chemical vapor deposition machine;

c) immersing said dispersion head into a chemical reaction tank and cleaning said dispersion head with an ultrasonic system;

d) immersing said dispersion head into a water tank;

e) immersing said dispersion head into an organic solvent tank; and f) drying said dispersion head into a drying system.

2. The method according to claim 1 wherein said chemical vapor deposition machine is one of an atmosphere chemical vapor deposition machine and a sub-atmosphere chemical vapor deposition machine.

3. The method according to claim 1 wherein said chemical vapor deposition machine is used for depositing a silicon oxide glass selected from a group consisting of Boron-phosphorous Silicon Dioxide (BPSG), Boron Silicon Dioxide (BSG), Phosphorous Silicon Dioxide (PSG), Undoping Silicon Dioxide (USG) and Non-doping Silicon Dioxide (NSG).

4. The method according to claim 1 wherein said chemical reaction tank is filled with an aqueous solution containing 12% hydrogen peroxide ($H_2O_2$).

5. The method according to claim 4 wherein said aqueous solution further contains sodium ion ($Na^+$).

6. The method according to claim 5 wherein said aqueous solution further contains potassium ion ($K^+$).

7. The method according to claim 1 wherein said water tank is an overflow water tank.

8. The method according to claim 1 wherein said organic solvent tank is an isopropyl alcohol (IPA) tank.

9. The method according to claim 8 wherein said isopropyl alcohol (IPA) tank is equipped with recyclable pipe.

10. The method according to claim 1 wherein said drying system is controlled at a temperature of 120° C.

11. The method according to claim 10 wherein said drying system is equipped with injected nitrogen gas.

12. The method according to claim 11 wherein said drying system further includes a mesh for dispersing heated nitrogen gas, thereby uniformly passing said nitrogen gas through said dispersion head.

13. The method according to claim 12 wherein said mesh is made of aluminum.

* * * * *